United States Patent
Zhao (10) Patent No.: US 8,305,007 B2
(45) Date of Patent: Nov. 6, 2012

(54) ANALOG-TO-DIGITAL CONVERTER WITH NON-UNIFORM ACCURACY

(75) Inventor: Bin Zhao, Irvine, CA (US)

(73) Assignee: Freescale Semiconductor, Inc., Austin, TX (US)

( * ) Notice: Subject to any disclaimer, the term of this patent is extended or adjusted under 35 U.S.C. 154(b) by 655 days.

(21) Appl. No.: 12/504,841

(22) Filed: Jul. 17, 2009

(65) Prior Publication Data

US 2011/0012519 A1 Jan. 20, 2011

(51) Int. Cl.
G05F 1/00 (2006.01)

(52) U.S. Cl. .......................... 315/291; 341/143; 341/160

(58) Field of Classification Search .......... 341/156–163; 315/185 R, 185 S, 209 R, 210, 224–226, 315/246–249, 291, 294, 299–302, 307–308, 315/312, 324, 360; 345/204, 214, 82
See application file for complete search history.

(56) References Cited

U.S. PATENT DOCUMENTS

| | | |
|---|---|---|
| 3,973,197 A | 8/1976 | Meyer |
| 4,162,444 A | 7/1979 | Rodgers |
| 4,615,029 A | 9/1986 | Hu et al. |
| 4,649,432 A | 3/1987 | Watanabe et al. |
| 4,686,640 A | 8/1987 | Simison |
| 5,025,176 A | 6/1991 | Takeno |
| 5,038,055 A | 8/1991 | Kinoshita |
| 5,455,868 A | 10/1995 | Sergent et al. |
| 5,508,909 A | 4/1996 | Maxwell et al. |
| 5,635,864 A | 6/1997 | Jones |
| 5,723,950 A | 3/1998 | Wei et al. |
| 6,002,356 A | 12/1999 | Cooper |
| 6,281,822 B1 | 8/2001 | Park |
| 6,373,423 B1 | 4/2002 | Knudsen |
| 6,636,104 B2 | 10/2003 | Henry |
| 6,822,403 B2 | 11/2004 | Horiuchi et al. |
| 6,864,641 B2 | 3/2005 | Dygert |
| 6,943,500 B2 | 9/2005 | LeChevalier |

(Continued)

FOREIGN PATENT DOCUMENTS

JP 2003332624 A 11/2003

(Continued)

OTHER PUBLICATIONS

Notice of Allowance mailed Jan. 9, 2012 for U.S. Appl. No. 12/367,672, filed Feb. 9, 2009, entitled "Serial Configuration for Dynamic Power Control in LED Displays", 14 pages.

(Continued)

*Primary Examiner* — Shawki S Ismail
*Assistant Examiner* — Christopher Lo (57) ABSTRACT

An analog-to-digital converter (ADC) implements non-uniform conversion accuracy so as to allow for high conversion accuracy for a select narrower input range while also accommodating a wider overall input range and requiring fewer conversion bits compared to conventional ADCs. The ADC includes an ADC core that receives an input signal and outputs a first digital value having a first number of bits, the first digital value based on the input signal and an accuracy configuration of the ADC core. The ADC also includes an encoder to generate a second digital value have a second number of bits, greater than the first number of bits, based on the first digital value and the accuracy configuration of the ADC core. The ADC further includes an accuracy controller to adjust the accuracy configuration of the ADC core based on a relationship between the first digital value and at least one threshold.

20 Claims, 7 Drawing Sheets

U.S. PATENT DOCUMENTS

| | | | |
|---|---|---|---|
| 7,211,958 B2 | 5/2007 | Maurer et al. | |
| 7,262,724 B2 | 8/2007 | Hughes et al. | |
| 7,307,614 B2 | 12/2007 | Vinn | |
| 7,315,095 B2 | 1/2008 | Kagemoto et al. | |
| 7,391,280 B2 | 6/2008 | Hsu | |
| 7,436,378 B2 | 10/2008 | Ito et al. | |
| 7,459,959 B2 | 12/2008 | Rader et al. | |
| 7,511,545 B1 | 3/2009 | Kesler | |
| 7,598,686 B2 | 10/2009 | Lys et al. | |
| 7,696,915 B2 | 4/2010 | Chmelar et al. | |
| 7,777,704 B2 | 8/2010 | S et al. | |
| 7,888,888 B2 | 2/2011 | Huang et al. | |
| 7,973,495 B2 | 7/2011 | Ion et al. | |
| 2002/0003511 A1* | 1/2002 | Havel | 345/39 |
| 2004/0208011 A1 | 10/2004 | Horiuchi et al. | |
| 2004/0233144 A1 | 11/2004 | Rader et al. | |
| 2006/0164162 A1 | 7/2006 | Dauphinee et al. | |
| 2006/0186830 A1 | 8/2006 | Shami et al. | |
| 2006/0261895 A1 | 11/2006 | Kocaman et al. | |
| 2007/0080911 A1 | 4/2007 | Liu et al. | |
| 2007/0146191 A1* | 6/2007 | Iwata et al. | 341/155 |
| 2007/0253330 A1 | 11/2007 | Tochio et al. | |
| 2007/0290915 A1* | 12/2007 | Morimoto | 341/161 |
| 2008/0054815 A1 | 3/2008 | Kotikalapoodi | |
| 2008/0129224 A1 | 6/2008 | Shih et al. | |
| 2008/0143576 A1* | 6/2008 | Chen et al. | 341/162 |
| 2008/0238341 A1 | 10/2008 | Korcharz et al. | |
| 2008/0297067 A1 | 12/2008 | Wang et al. | |
| 2009/0108775 A1 | 4/2009 | Sandner et al. | |
| 2009/0128045 A1 | 5/2009 | Szczeszynski et al. | |
| 2009/0187925 A1 | 7/2009 | Hu et al. | |
| 2009/0230874 A1 | 9/2009 | Zhao et al. | |
| 2009/0230891 A1 | 9/2009 | Zhao et al. | |
| 2009/0273288 A1 | 11/2009 | Zhao et al. | |
| 2009/0315481 A1 | 12/2009 | Zhao | |
| 2010/0013395 A1 | 1/2010 | Archibald et al. | |
| 2010/0013412 A1 | 1/2010 | Archibald et al. | |
| 2010/0026203 A1 | 2/2010 | Zhao et al. | |
| 2010/0085295 A1 | 4/2010 | Zhao et al. | |
| 2010/0156315 A1 | 6/2010 | Zhao et al. | |

FOREIGN PATENT DOCUMENTS

| | | | |
|---|---|---|---|
| JP | 2005116199 A | 4/2005 | |
| KR | 1020070082004 A | 8/2007 | |
| WO | 2005022596 A2 | 3/2005 | |

OTHER PUBLICATIONS

Notice of Allowance mailed Dec. 14, 2011 for U.S. Appl. No. 12/363,179, filed Jan. 30, 2009, entitled "LED Driver With Segmented Dynamic Headroom Control", 14 pages.

Non-Final Office Action mailed Jan. 18, 2012 for U.S. Appl. No. 12/183,492, filed Jul. 31, 2008, 37 pages.

PCT Application No. PCT/US2010/028289; Search Report and Written Opinion dated Dec. 15, 2010.

Notice of Allowance mailed Apr. 7, 2011 for U.S. Appl. No. 12/326,963, 20 pages.

Non-Final Office Action mailed Apr. 19, 2011 for U.S. Appl. No. 12/363,294, 19 pages.

Non-Final Office Action mailed Apr. 19, 2011 for U.S. Appl. No. 12/363,607, 17 pages.

Mc Nerney, Tim, "constant-current power supply for Luxeon 5W LED with low-voltage warning and shut-off Software Documentation, as shipped to Mali in first 45 prototypes," Nov. 2004, www.designthatmatters.org/ke/pubs/kled-doc.txt, 5 pages.

Maxim: "Application Note 810, Understanding Flash ADCs," Oct. 2, 2001, 8 pages.

National Semiconductor Data Sheet: "LM3432/LM3432B 6-Channel Current Regulator for LED Backlight Application," May 22, 2008, pp. 1-18.

U.S. Appl. No. 12/537,443, filed Aug. 7, 2009, entitled Pulse Width Modulation Frequency Conversion.

U.S. Appl. No. 12/703,239, filed Feb. 10, 2010, entitled "Pulse Width Modulation With Effective High Duty Resolution".

U.S. Appl. No. 12/537,692, filed Aug. 7, 2009, entitled "Phase-Shifted Pulse Width Modulation Signal Generation".

U.S. Appl. No. 12/625,818, filed Nov. 25, 2009, entitled "Synchronized Phase-Shifted Pulse Width Modulation Signal Generation".

U.S. Appl. No. 12/703,249, filed Feb. 10, 2010, entitled "Duty Transition Control in Pulse Width Modulation Signaling".

Luke Huiyong Chung, Electronic Products: "Driver ICs for LED BLUs," May 1, 2008, 3 pages.

Akira Takahashi, Electronic Products: "Methods and features of LED drivers," Mar. 2008, 3 pages.

U.S. Appl. No. 12/340,985, filed Dec. 22, 2008, entitled "LED Driver With Feedback Calibration".

U.S. Appl. No. 12/326,963, filed Dec. 3, 2008, entitled "LED Driver With Precharge and Track/Hold".

U.S. Appl. No. 12/367,672, filed Feb. 9, 2009, entitled "Configuration for Dynamic Power Control in LED Displays".

U.S. Appl. No. 12/424,326, filed Apr. 15, 2009, entitled "Peak Detection With Digital Conversion".

Texas Instruments Publication, "Interleaved Dual PWM Controller with Programmable Max Duty Cycle," SLUS544A, (UCC28220, UCC28221) Sep. 2003, pp. 1-28.

U.S. Appl. No. 12/690,972, filed Jan. 21, 2010, entitled "Serial Cascade of Minimum Tail Voltages of Subsets of LED Strings for Dynamic Power Contrl in LED Displays".

U.S. Appl. No. 12/363,607, filed Jan. 30, 2009, entitled "LED Driver With Dynamic Headroom Control".

International Application No. PCT/US2009/035284, Search Report and Written Opinion, Oct. 28, 2009, 11 pages.

Notice of Allowance mailed Jun. 21, 2011 for U.S. Appl. No. 12/340,985, 27 pages.

Non-Final Office Action mailed May 4, 2011 for U.S. Appl. No. 12/367,672, 26 pages.

Notice of Allowance mailed Jul. 19, 2011 for U.S. Appl. No. 12/424,326, 27 pages.

Notice of Allowance mailed Aug. 1, 2011 for U.S. Appl. No. 12/363,294, 11 pages.

Ex parte Quayle mailed Jul. 20, 2011 for U.S. Appl. No. 12/363,179, 25 pages.

Notice of Allowance mailed Aug. 11, 2011 for U.S. Appl. No. 12/363,607, 9 pages.

Office Action—NFOA Feb. 4, 2010, 11 pages.

Office Action—NOA Jun. 2, 2010, 7 pages.

Office Action—NOA Jul. 9, 2010, 12 pages.

International App. No. PCT/US2009/065913, Search Report mailed Jul. 7, 2010, 4 pages.

Notice of Allowance mailed Sep. 27, 2011 for U.S. Appl. No. 12/504,335, 35 pages.

Final Office Action mailed Oct. 20, 2011 for U.S. Appl. No. 12/367,672, 24 pages.

Final Office Action mailed May 1, 2012 for U.S. Appl. No. 12/183,492, filed Jul. 31, 2008, 15 pages.

* cited by examiner

ANALOG-TO-DIGITAL CONVERTER WITH NON-UNIFORM ACCURACY

FIELD OF THE DISCLOSURE

The present disclosure relates generally to analog-to-digital conversion.

BACKGROUND

Analog-to-digital converters (ADCs) frequently are used to digitize an analog signal. In many implementations, the analog signal may vary significantly and thus the ADC must have a wide input range. This wide input range poses a problem with respect to conversion accuracy for conventional ADCs. A conventional ADC can be designed with higher number of conversion bits to achieve a desired conversion accuracy, but at the expense of increased complexity, increased silicon area, and increased power consumption. Conversely, a conventional ADC can be designed with a lower number of conversion bits with the benefits of decreased complexity, decreased silicon area, and decreased power consumption, but at the expense of conversion accuracy.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 6:
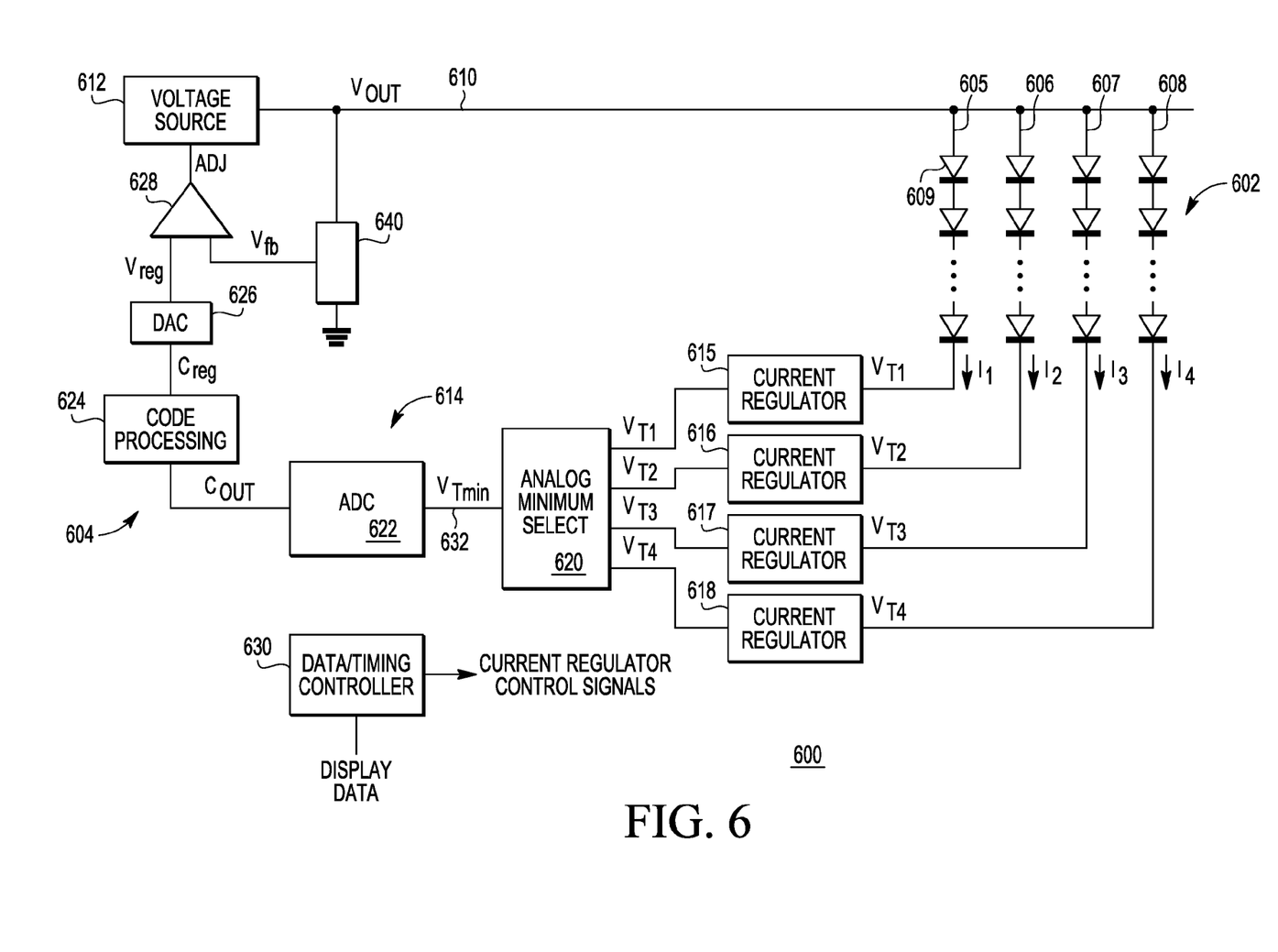
FIG. 6 is a diagram illustrating an example light emitting diode (LED) system implementing the ADC of FIG. 1 for dynamic headroom control in accordance with at least one embodiment of the present invention.
Figure 7:
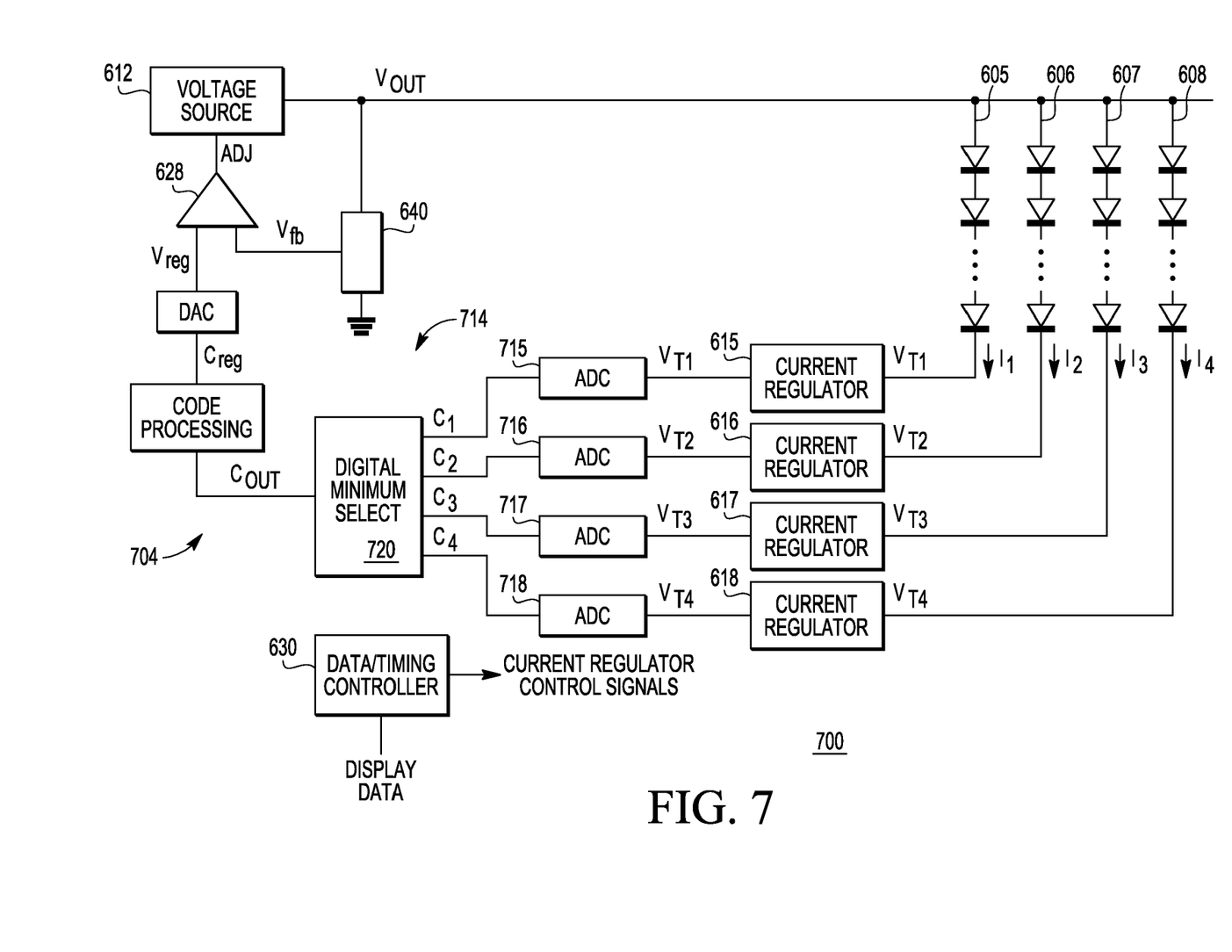
FIG. 7 is a diagram illustrating another example light emitting diode (LED) system implementing the ADC of FIG. 1 for dynamic headroom control in accordance with at least one embodiment of the present invention.

FIGS. 1-5 illustrate an analog-to-digital converter (ADC) that implements non-uniform conversion accuracy so as to allow for high conversion accuracy for a select narrower input range while accommodating a wider overall input range and requiring fewer conversion bits compared to conventional ADCs. FIGS. 6 and 7 illustrate example implementations of the ADC in light emitting diode (LED) systems. Although the ADC can be advantageously used in LED systems such as those described below, the ADC is not limited to this implementation, but instead can be used in any of a variety of analog-to-digital conversion contexts.

Figure 1:
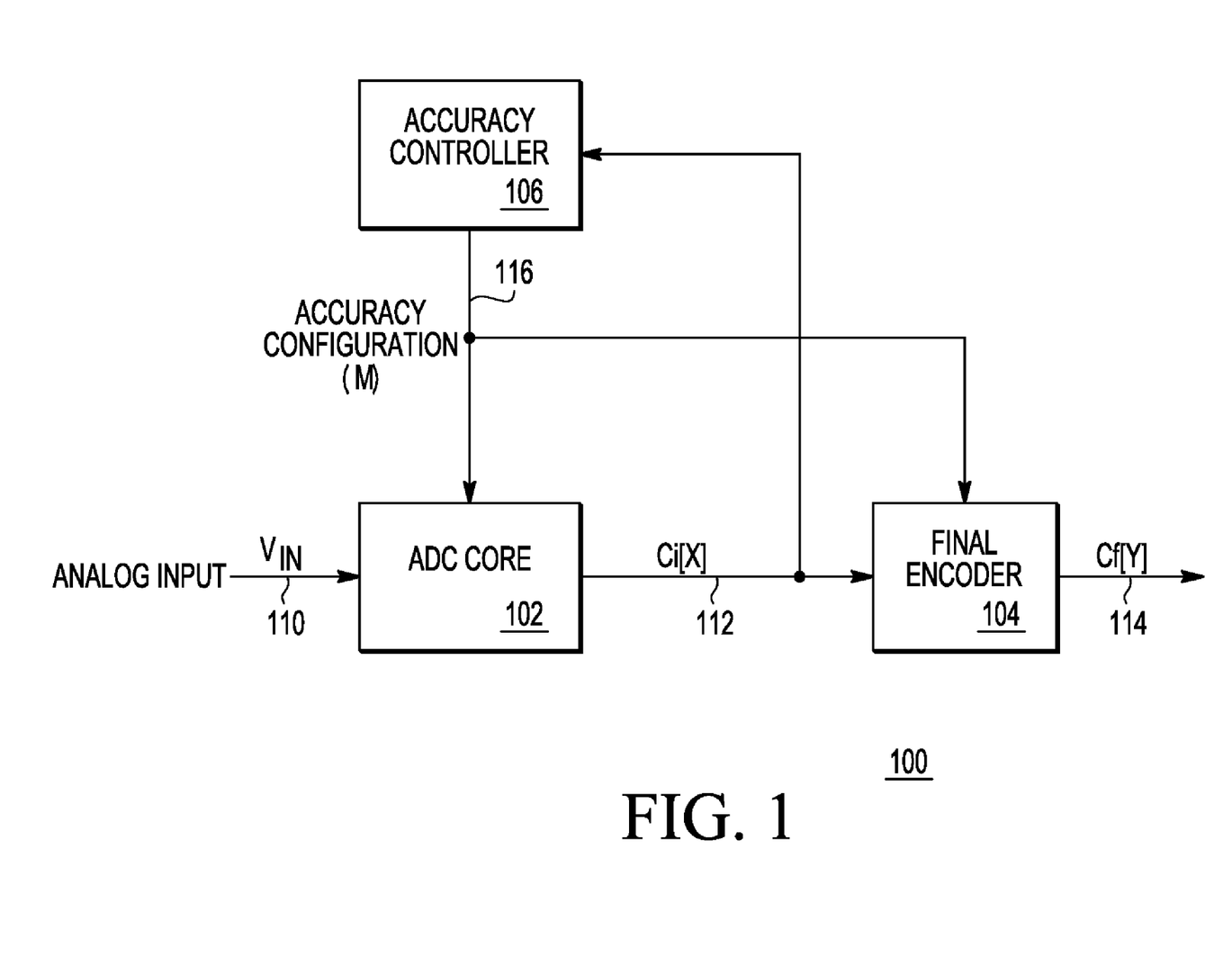
FIG. 1 is a diagram illustrating an analog-to-digital converter (ADC) with non-uniform conversion accuracy in accordance with at least one embodiment of the present invention.

FIG. 1 illustrates an ADC 100 having non-uniform conversion accuracy in accordance with at least one embodiment of the present disclosure. In the depicted example, the ADC 100 includes an ADC core 102, a final encoder 104, and an accuracy controller 106. The ADC core 102 is configured to receive an analog input signal 110 and convert the voltage $V_{IN}$ of the analog input signal 110 at a selected sample point to a corresponding digital value (identified herein as intermediate code value Ci 112) having X bits (i.e., X conversion bits) based on the voltage $V_{IN}$ and a selected accuracy configuration (identified herein as configuration parameter M) of the ADC core 102. The final encoder 104 then encodes the intermediate code value Ci 112 based on the configuration parameter M to output a digital value (identified herein as final code value Cf 114) having Y bits (Y being greater than X). The accuracy controller 106 receives the intermediate code value Ci 112 and adjusts the accuracy configuration of the ADC core 102 (through signaling 116) for the next sampling point based on a relationship between the intermediate code value Ci 112 and one or more thresholds. The ADC core 102 then may convert the voltage $V_{IN}$ of the analog input signal 110 at the next sample point based on the adjusted accuracy configuration to generate the next intermediate code value Ci for final encoding and output by the final encoder 104 as the next final code value Cf.

The accuracy controller 106 controls the analog-to-digital conversion accuracy of the ADC core 102 as well as the input range of the ADC core 102. The accuracy controller 106, in one embodiment, adjusts the accuracy configuration of the ADC core 102 for the next sample point based on where the voltage $V_{IN}$ of the analog input signal 110 falls in the context of the current accuracy configuration of the ADC core 102. As discussed in greater detail below, the accuracy controller 106 can adjust the accuracy of the ADC core 102 by adjusting the reference voltages of the ADC core 102, by scaling and/or shifting the voltage $V_{IN}$ of the analog input signal 110 (i.e., by scaling and/or shifting the voltage $V_{IN}$ relative to the reference voltages of the ADC core 102), or a combination thereof.

To illustrate the process of adjusting the reference voltages of the ADC core 102, assume the current reference voltages of the ADC core 102 is, for example, from 0 volts (V) to 16 volts (V), the ADC core 102 and the intermediate code value Ci 112 indicates that the voltage $V_{IN}$ is at 5 V. In most instances, it would be reasonable to expect that the voltage $V_{IN}$ of the analog input signal 110 at the next sample point also is somewhere in the proximity of 5V and thus the accuracy controller 106 may change the reference voltages of the ADC core 102 for the next sample point to from 0 V to 8 V while keeping the rest of the ADC core 102 unchanged for a 200% increase in accuracy for the next sample point. Further, if the intermediate code value Ci 112 indicates that the voltage $V_{IN}$ is at 1 V, in this instance the accuracy controller 106 can predict that the voltage $V_{IN}$ of the analog input signal 110 at the next sample point will be near 1 V and thus change the reference voltages of the ADC core 102 to, for example, from 0 V to 2 V while keeping the rest of the ADC core 102 unchanged for an 800% increase in accuracy for the next sample point. Conversely, if the intermediate code value Ci 112 indicates that the voltage $V_{IN}$ is at 14 V, in this instance the accuracy controller 106 can predict that the voltage $V_{IN}$ of the analog input signal 110 will stay near 14 V and thus maintain the reference voltages of the ADC core 102 at from 0 V to 16 V.

By adjusting the reference voltages of the ADC core 102 based on the current voltage $V_{IN}$ of the analog input signal 110 (referenced through the intermediate code value Ci 112) and the current reference voltages, the ADC 100 can provide a suitable conversion accuracy, particularly at the most relevant input voltage ranges, while requiring fewer conversion bits compared to conventional ADCs that utilize a fixed reference voltages. To illustrate, assume a conventional ADC has four conversion bits (e.g., a 4-bit ADC) and thus can provide 16 ($2^4$) levels of resolution. Thus, for fixed reference voltages of, for example, 0 V (the low reference voltage) and 4 V (the high reference voltage), the accuracy or resolution step size of the conventional ADC is 0.25 V (4 V/16 resolution steps). If the most relevant input voltage range is from 0 V to 1 V, when the analog input signal for this conventional ADC varies within the range of 0 to 1 V, the conventional ADC could have a conversion error of approximately 0.25 V. However, assuming the ADC core 102 also has four conversion bits, the accuracy controller 106 can set the reference voltages of the ADC core 102 to from 0 V to 1 V, with a resulting accuracy or resolution step size of 0.0625 V (1 V/16 resolution steps). At this resolution step size, the ADC 100 has a potential conversion error of only approximately 0.0625 V. For a conventional ADC with a fixed reference voltage range of from 0 V to 4 V to provide a similar conversion accuracy when the analog input signal is within the range of 0 to 1 V, the conventional ADC would require six conversion bits (i.e., a 6-bit ADC), with the increased complexity and silicon area that entails.

Because the ADC core 102 generates the intermediate code value Ci 112 based on the relationship between the voltage $V_{IN}$ of the analog input signal 110 and the selected reference voltages of the ADC core 102, the intermediate code value Ci 112 is a relative value scaled and/or shifted to the particular reference voltages of the ADC core 102. Accordingly, the final encoder 104 generates the final code value Cf 114 by scaling and shifting the intermediate code value Ci 112 based on the selected reference voltages under which the intermediate code value Ci 112 was generated. As described in greater detail below, the different reference voltage ranges implemented at ADC core 102 can be scaled by a power of 2 (e.g., from 0 V to 0.5 V, from 0 V to 1 V, from 0 V to 2 V, from 0 V to 4 V, etc.). In this implementation the final encoder 104 can generate the final code value Cf 114 through a bit-stuffing process to convert the X-bit intermediate code value Ci 112 to the Y-bit final code value by concatenating a total of X-Y zeros at least one end of the intermediate code value Ci 112, where the number of zeros concatenated to the least significant bit (LSB) of the intermediate code value Ci 112 increases as the reference voltage range increases. Other methods of encoding the intermediate code value Ci 112 to accommodate for the scaling and shifting which results from some particular reference voltages (e.g., from 0.5 V to 1 V, from 1 V to 2 V, etc.) of the ADC core 102 can be implemented without departing from the scope of the present disclosure.

Through adjusting the reference voltages of the ADC core 102 based on the current measured level of $V_{IN}$ so as to more closely align with the expected level of $V_{IN}$ at the next sample point, the ADC 100 can provide the accuracy of a Y-bit ADC at a particular input range while implementing only an X-bit ADC core. However, it will be appreciated that the ADC accuracy is not uniformly or evenly distributed across the entire maximum input range of the ADC core 102. To illustrate, for a 4-bit ADC core 102 with a final 7-bit output, a 0-4 V maximum input range, and four accuracy configurations with corresponding reference ranges (0-0.5 V, 0-1 V, 0-2 V, and 0-4 V), the ADC 100 has an accuracy reading of 31.25 mV (1 LSB) in the 0-0.5 V reference range, an accuracy reading of 62.5 mV (2 LSB) in the 0-1 V reference range, an accuracy reading of 125 mV (4 LSB) in the 0-2 V reference range, and an accuracy reading of 250 mV (8 LSB) in the 0-4 V reference range. However, the analog input signal being converted often converges on a target value over time and thus the ADC 100 can be configured to provide the highest conversion accuracy at or around this target value without appreciable detrimental effects due to the relatively lower conversion accuracy for the wider input ranges that become less relevant once the analog input signal settles within the target range.

Figure 2:
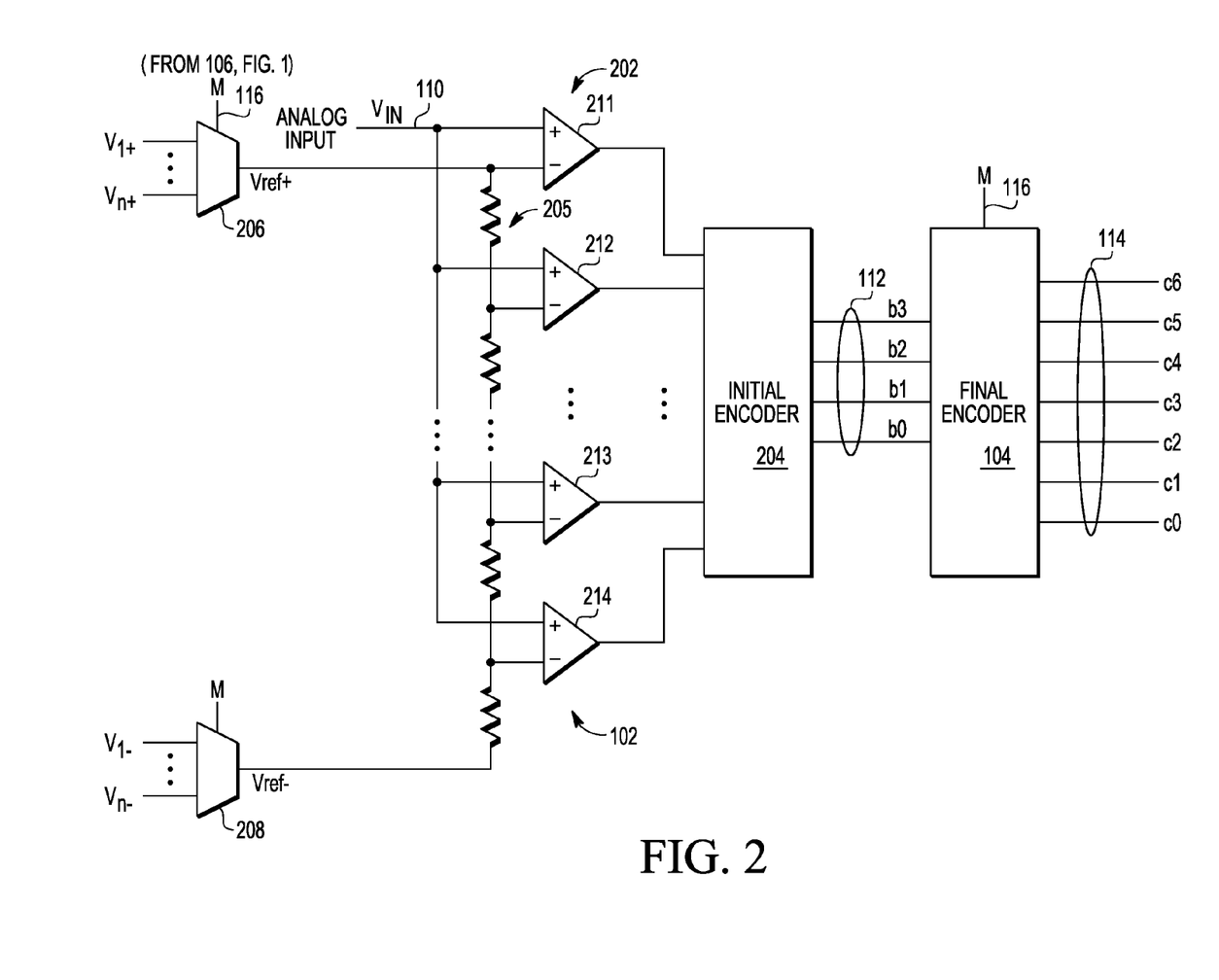
FIG. 2 is a diagram illustrating an implementation of the ADC of FIG. 1 as a flash ADC with non-uniform conversion accuracy provided via an adjustable reference voltage range in accordance with at least one embodiment of the present invention.

FIG. 2 illustrates an example implementation of the ADC core 102 and the final encoder 104 of the ADC 100 in accordance with at least one embodiment of the present disclosure. In the depicted example of FIG. 2, the ADC core 102 is implemented as a flash ADC 202 having adjustable reference voltages through adjustment of one or both of the end reference voltages of the flash ADC 202. The flash ADC 202 includes an initial encoder 204, a resistive ladder 206, and a plurality of clock-latched (clock signal not shown) comparators (illustrated by comparators 211, 212, 213, and 214). The resistive ladder 206 includes a plurality of resistors in series between two terminals: one terminal coupled to receive an end reference voltage Vref+ and the other terminal coupled to receive another end reference voltage Vref−. The positive input of each comparator receives the analog input signal 110 (or a representation thereof) and the negative input of each of the comparators is coupled to a corresponding position of the resistive ladder 206 such that there is a certain voltage drop between the negative input of each comparator and the negative input of the next comparator in the parallel arrangement. In accordance with the operation of the flash ADC 202, the outputs of the comparators together provide a thermometer code output, which is encoded by the initial encoder 204 to generate the intermediate code value Ci 112. In the depicted example, the flash ADC 202 is a 4-bit ADC and thus includes 15 or 16 comparators (four comparators are illustrated), which generate a 15-bit or 16-bit thermometer code. The thermometer code in turn is encoded by the initial encoder 204 to generate a 4-bit (binary) intermediate code value Ci 112 with bits [b3_b2_b1_b0].

In the depicted arrangement, the reference voltages between Vref+ and Vref− constitutes the reference voltages of the flash ADC 202. Accordingly, to facilitate the adjustment of the reference voltages through adjustment of the end reference voltages Vref+ and Vref−, the flash ADC 202 includes multiplexers 206 and 208. The multiplexer 206 includes a plurality of inputs to receive a plurality of reference voltages (V1+, . . . , Vn+) from one or more voltage sources (not shown), a selector input to receive the signaling 116 from the accuracy controller 106 that identifies the configuration parameter M (representative of the accuracy configuration to be implemented), and an output to provide a select one of the reference voltages (V1+, . . . , Vn+) as the end reference voltage Vref+ based on the configuration parameter M. Likewise, multiplexer 208 includes a plurality of inputs to receive a plurality of reference voltages (V1−, . . . , Vn−) from one or more voltage sources (not shown), a selector input to receive the signaling 116 from the accuracy controller 106, and an output to provide a select one of the reference voltages (V1−, . . . , Vn−) as the end reference voltage Vref− based on the configuration parameter M. Thus, the accuracy controller 106 can adjust the reference voltages of the flash ADC 202 by adjusting the end reference voltages across the resistive ladder 206 via the multiplexers 206 and 208. For example, to implement reference voltages in the range of 0.5-1 V, the accuracy controller 106 can control the multiplexers 208 and 206 to output voltages of 0.5 V and 1 V as Vref− and Vref+, respectively.

In the depicted embodiment, the final encoder 104 receives the four bits [b3_b2_b1_b0] output by the initial encoder 204 as the intermediate code value Ci 112 and encodes the four bits to generate the final code value Cf 114 having seven (7) bits [c6_c5_c4_c3_c2_c1_c0] (i.e., X=4, Y=7 in this example). In one embodiment, the flash ADC core 202 implements four accuracy configurations, each one double the reference voltage range of the previous one. To illustrate, the four accuracy configurations can have, for example, reference voltages with low/high ranges of 0-0.5 V, 0-1 V, 0-2 V, and 0-4 V, respectively. For these particular four accuracy configurations, the conversion of the four-bit value of the intermediate code value Ci 112 to the corresponding seven-bit value for the final code value Cf 114 performed by the final encoder 104 can be represented by the following expression:

$Cf=[(3-M)0's]\_b3\_b2\_b1\_b0\_[M0's], M=\{0, 1, 2, or 3\}$ where M represents the different configuration modes of different accuracy and reference voltage range, with M=0 representing the highest accuracy and the smallest, or minimum, reference range and M=3 representing the lowest accuracy and the largest, or maximum, reference range. As an example, assume that a value b3_b2_b1_b1=1_0_1_1 for the intermediate code value Ci 112 was generated by the flash ADC core 202. Table 1 below illustrates the different values for the final code value Cf 114 resulting from the bit-stuffing process described above.

TABLE 1

Example Encoding of Intermediate Code Value Ci of 1_0_1_1

| Reference Range M | Final code value Cf |
| --- | --- |
| 0 | 0_0_0_1_0_1_1 |
| 1 | 0_0_1_0_1_1_0 |
| 2 | 0_1_0_1_1_0_0 |
| 3 | 1_0_1_1_0_0_0 |

The insertion of the 0's based on the configurations with particular reference range (0-0.5 V, 0-1 V, 0-2 V, and 0-4 V) can be accomplished by the final encoder 104 using, for example, a shift register that left-shifts the 4-bit intermediate code Ci by the corresponding number M representative of the configuration of the flash ADC core 202 used to generate the intermediate code Ci.

As noted, the above expression illustrates the final encoding for the four example accuracy configurations with the reference voltage ranges of 0-0.5 V, 0-1 V, 0-2 V, and 0-4 V. Using the guidelines provided herein, the same principles can be applied to generate the final encoding of the intermediate code values for a different number of accuracy configurations, for accuracy configurations with different reference voltages, or a combination thereof.

Figure 3:
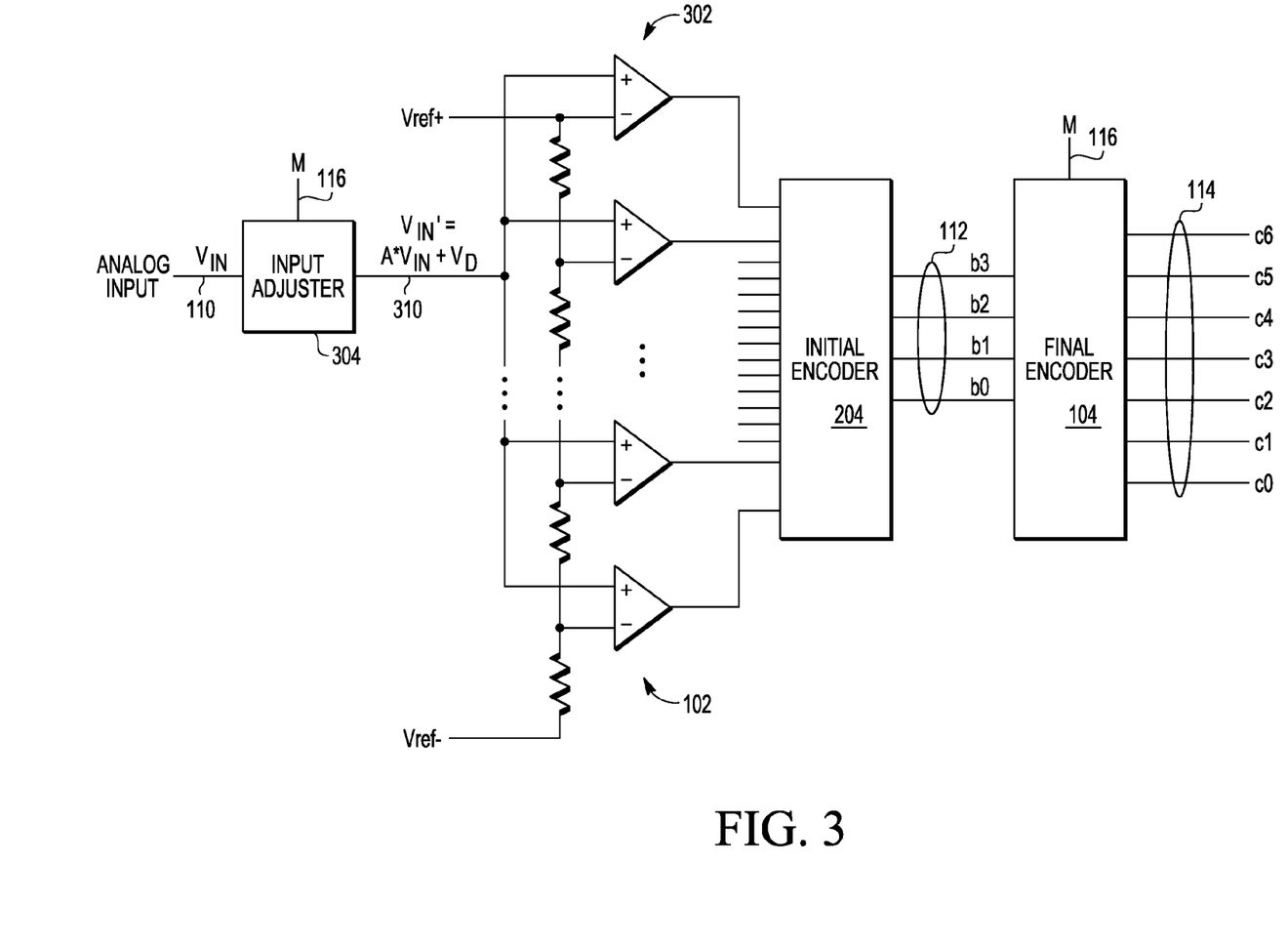
FIG. 3 is a diagram illustrating an implementation of the ADC of FIG. 1 as a flash ADC with non-uniform conversion accuracy provided via relative adjustment of the input signal in accordance with at least one embodiment of the present invention.

FIG. 3 illustrates another example implementation of the ADC core 102 and the final encoder 104 of the ADC 100 in accordance with at least one embodiment of the present disclosure. In the depicted example of FIG. 3, the ADC core 102 is implemented in a similar manner as the implementation of FIG. 2 with a flash ADC 302, the initial encoder 204, and the final decoder 104. The flash ADC 302 is similar to the flash ADC 202 of FIG. 2 with the clock-latched comparators and resistive ladder. However, unlike the flash ADC 202, the end reference voltages Vref+ and Vref− are fixed. Thus, rather than adjusting the accuracy configuration of the ADC core 102 by changing one or both of the end reference voltages Vref+ and Vref−, the flash ADC 302 instead includes an input adjuster module 304 that adjusts the analog input signal 110 relative to the fixed end reference voltages of the flash ADC 302 to generate an adjusted input signal 310 with a voltage $V_{IN'}$. In one embodiment, the input adjuster module 304 scales the voltage $V_{IN}$ by a non-zero factor A and introduces an offset $V_O$ (which may be positive, negative, or zero) to generate the voltage $V_{IN'}$, where $V_{IN'}=A*V_{IN}+V_O$. To implement the scaling of the voltage $V_{IN}$, the input adjuster module 304 can include, for example, a switched capacitor circuit, an amplifier, etc. The scaling factor A and the offset $V_O$ are selected based on the configuration parameter M provided via signaling 116. In accordance with the operation of the flash ADC 302, the outputs of the comparators together provide a thermometer code output, which is encoded by the initial encoder 204 to generate the intermediate code value Ci 112. In the depicted example, the flash ADC 302 is a 4-bit ADC and thus includes 15 or 16 comparators (four comparators are illustrated), which generate a 15-bit or 16-bit thermometer code. The thermometer code in turn is encoded by the initial encoder 204 to generate a 4-bit (binary) intermediate code value Ci 112 with bits [b3_b2_b1_b0]. The intermediate code value Ci 112 is then encoded by the final encoder 104 based on the configuration parameter M to generate the final code value Cf 114 as described above.

Rather than solely adjusting the reference voltages to provide the desired accuracy configuration as illustrated by FIG. 2 or solely adjusting the analog input signal relative to fixed reference voltages to provide the desired accuracy configuration as illustrated by FIG. 3, the desired accuracy configuration can instead be achieved through the appropriate combination of both adjusting the reference voltages and adjusting the analog input signal through scaling and/or an offset (i.e., through a combination of the approaches of FIGS. 2 and 3). Further, although FIGS. 2 and 3 illustrate an example implementation of the ADC core 102 as a flash ADC, the ADC core 102 is not limited to a flash ADC implementation but rather can include any of a variety of ADCs or combinations thereof, including a pipeline ADC, a sigma-delta ADC, a successive-approximation ADC, and the like.

Figure 4:
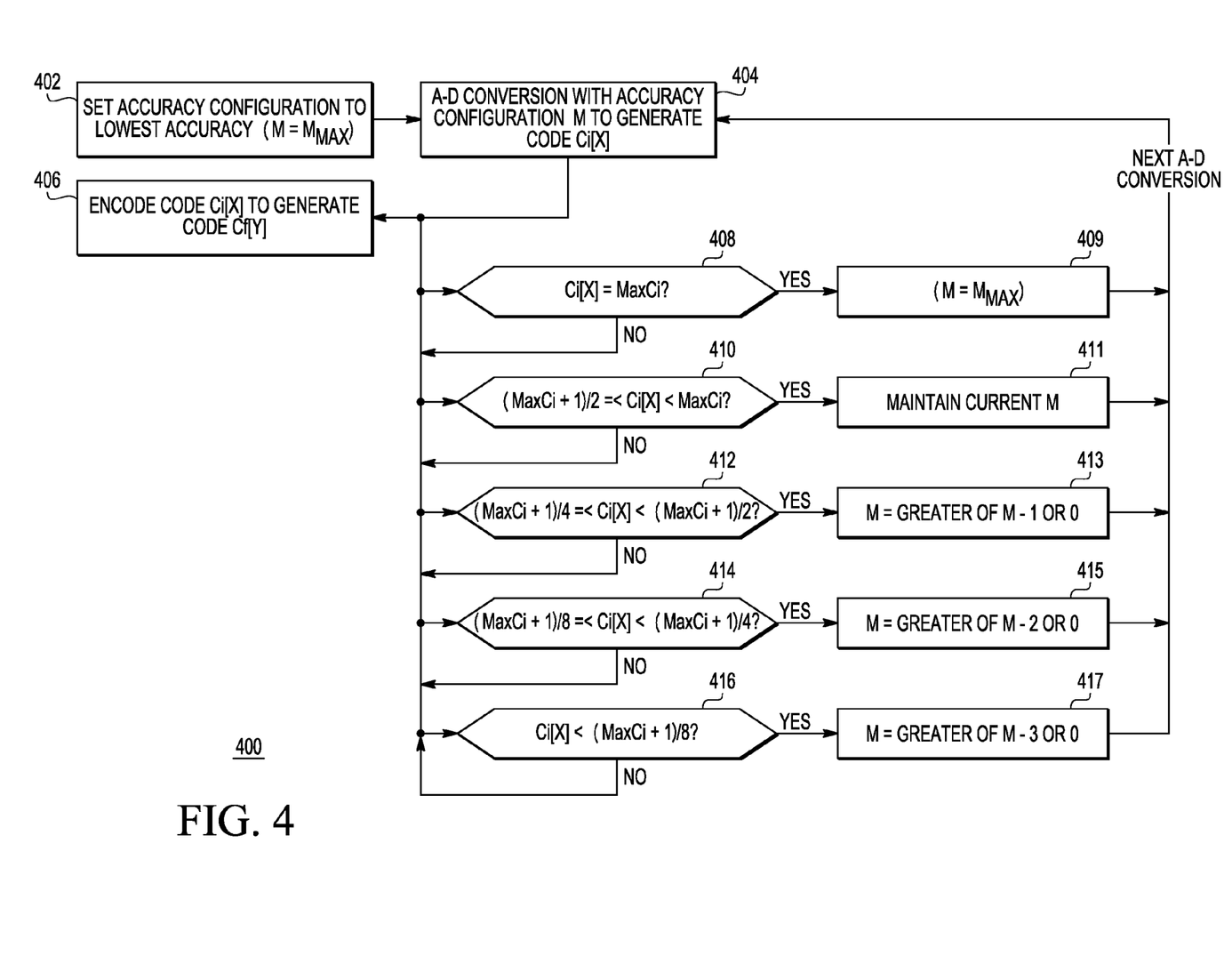
FIG. 4 is a flow diagram illustrating an example operation of the ADC of FIG. 1 in accordance with at least one embodiment of the present invention.

FIG. 4 illustrates an example operation 400 of the ADC 100 in accordance with at least one embodiment of the present disclosure. For illustrative purposes, the operation 400 of the ADC 100 is described in an example context of four accuracy configurations (M=0, 1, 2, or 3) with reference voltage ranges of 0-0.5 V, 0-1 V, 0-2 V, and 0-4 V, respectively. At block 402, the accuracy controller 106 initializes the ADC core 102 by setting the ADC core 102 to the configuration with lowest accuracy and the largest, or maximum, reference range of the four reference ranges (i.e., sets the configuration parameter $M=M_{max}=3$). At block 404, the ADC core 102 converts the voltage $V_{IN}$ of the analog input signal 110 at the current sample point to the corresponding intermediate code value Ci 112 with the ADC core 102 configured to the lowest accuracy. At block 406, the final encoder 104 encodes the intermediate code value Ci 112 based on the accuracy configuration (as indicated by the configuration parameter M) to which the ADC core 102 was set when generating the intermediate code value Ci 112. As discussed above, the final encoding process can include, for example, inserting zeros at one or both of the LSB and the MSB of the intermediate code value Ci 112 to provide the appropriate scaling and/or shifting of the value to the expected final code value Cf 114.

While the analog-to-digital (A-D) conversion process of blocks 404 and 406 is performed for one sample point, the accuracy controller 106 prepares the ADC core 102 for the next sample point by using the intermediate code value Ci 112 from the current sample point to determine the accuracy configuration for the ADC core 102 for the next sample point. The intermediate code value Ci 112 represents where the voltage $V_{IN}$ of the analog input signal 110 falls within the current reference voltage range of the ADC core 102. Accordingly, in one embodiment, the accuracy controller 106 compares the intermediate code value Ci 112 to one or more thresholds (individual threshold values or threshold value ranges) and predicts an appropriate accuracy configuration for the ADC core 102 for the next sample point based on the results of these comparisons.

To illustrate, blocks 408, 410, 412, 414, and 416 together represent up to five comparisons that the accuracy controller 106 can make in any given order to determine the next accuracy configuration for ADC core 102. At block 408 the accuracy controller 106 compares the intermediate code value Ci 112 to the maximum intermediate code value (MaxCi) that can be output by the ADC core 102. A match indicates that the input signal $V_{IN}$ may be outside the reference voltage range and therefore the accuracy of the ADC core 102 should be lowered so that the input signal input signal can still be correctly converted into digital code at the lower accuracy. Accordingly, in the event of a match, the accuracy controller 106 at block 409 sets the accuracy configuration of the ADC core 102 to the lowest accuracy $M_{max}$ (e.g., M=3 in this example) with the maximum reference range for the next sample point. The A-D conversion process (represented by blocks 404 and 406) then is repeated for the next sample point with the adjusted accuracy configuration to the ADC core 102.

At block 410, the accuracy controller 106 determines whether the intermediate code value Ci 112 falls in a range between (MaxCi+1)/2 and MaxCi. An intermediate code value Ci meeting this threshold condition indicates that the current accuracy configuration was appropriate and with sufficient additional range to accommodate a relatively moderate change in the voltage $V_{IN}$ at the next sample point. Accordingly, if the intermediate code value Ci 112 falls into this range, there is no need to change the accuracy configuration, so at block 411 the accuracy controller 106 maintains the current accuracy configuration for the next sample point. The A-D conversion process (represented by blocks 404 and 406) then is repeated for the next sample point with the unchanged accuracy configuration.

At block 412, the accuracy controller 106 determines whether the intermediate code value Ci 112 falls in a range between (MaxCi+1)/4 and (MaxCi+1)/2. An intermediate code value Ci meeting this threshold condition indicates that the accuracy of current A-D conversion can be improved for the next sample point. Accordingly, if the intermediate code value Ci 112 falls into this range and based on the expectation that the value of $V_{IN}$ at the next sample point will not significantly deviate from the current value of $V_{IN}$, at block 413 the accuracy controller 106 changes the accuracy configuration for the ADC core 102 to the one with next higher accuracy (i.e., next M=current M−1) for the next sample point. If the current accuracy configuration provides the highest accuracy, the current configuration is maintained for the next sampling period. The A-D conversion process (represented by blocks 404 and 406) then is repeated for the next sample point with this adjusted accuracy configuration.

At block 414, the accuracy controller 106 determines whether the intermediate code value Ci 112 falls in a range between (MaxCi+1)/8 and (MaxCi+1)/4. An intermediate code value Ci meeting this threshold condition indicates that the accuracy of current A-D conversion can be significantly improved for the next sample point. Accordingly, if the intermediate code value Ci 112 falls into this range and based on the expectation that the value of $V_{IN}$ at the next sample point will not significantly deviate from the current value of $V_{IN}$, at block 415 the accuracy controller 106 changes the accuracy configuration of the ADC core 102 to the one with accuracy improvement of two levels (i.e., next M=current M−2) for the next sample point. If the current accuracy configuration is the one with the highest accuracy, the current configuration is maintained for the next sampling period. If the current accuracy configuration is the one with the second highest accuracy, the accuracy configuration is adjusted to the one with the highest accuracy for the next sampling period. The A-D conversion process (represented by blocks 404 and 406) then is repeated for the next sample point with this adjusted accuracy configuration.

At block 416, the accuracy controller 106 determines whether the intermediate code value Ci 112 is less than (MaxCi+1)/8. An intermediate code value Ci meeting this condition indicates that that the accuracy of current A-D conversion can be improved to the highest accuracy for the next sample point. Accordingly, if the intermediate code value Ci 112 falls into this range and based on the expectation that the value of $V_{IN}$ at the next sample point will not significantly deviate from the current value of $V_{IN}$, at block 417 the accuracy controller 106 sets the accuracy configuration of the ADC core 102 to the one with the highest accuracy (i.e., M=0) for the next sample point. The A-D conversion process (represented by blocks 404 and 406) then is repeated for the next sample point with this adjusted accuracy configuration.

Table 2 illustrates an example implementation of the operation 400 based on a 4-bit ADC core (thereby generating an intermediate code value Ci between 0 and 15) and four accuracy configurations of the reference voltage ranges of 0-4 V, 0-2 V, 0-1 V, and 0-0.5 V, respectively:

TABLE 2

| Ci | Adjustment |
| --- | --- |
| 0 or 1 | Next M = 0 (0-0.5 V) |
| 2 or 3 | Next M = Current M − 2 or 0 |
| 4 to 7 | Next M = Current M − 1 or 0 |
| 8 to 14 | Next M = Current M |
| 15 | Next M = $M_{max}$ (0-4 V) |

Figure 5:
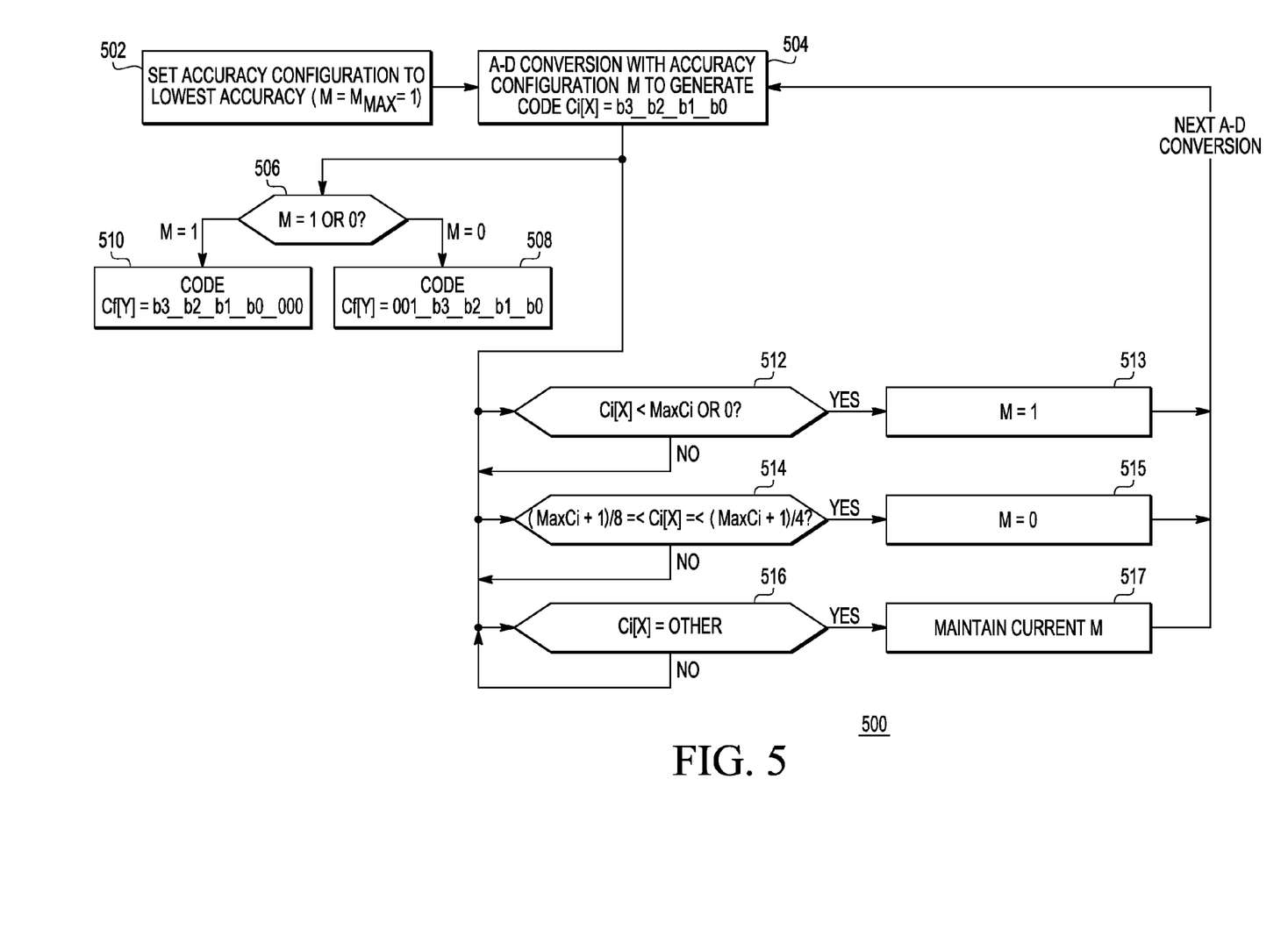
FIG. 5 is a flow diagram illustrating another example operation of the ADC of FIG. 1 in accordance with at least one embodiment of the present invention.

FIG. 5 illustrates another example operation 500 of the ADC 100 in accordance with at least one embodiment of the present disclosure. The operation 500 is described in the context of a 4-bit ADC implementation with two accuracy configurations: a higher accuracy of 31.25 mV (0.5 V/16) with a lower reference voltage range of 0.5-1.0V (M=0); and a lower accuracy of 250 mV (4 V/16) with a higher reference voltage range of 0-4 V (M=1). At block 502 the accuracy controller 106 initializes the ADC core 102 to the configuration of lower accuracy and higher reference range (M=1) of 0-4 V. At block 504, the ADC core 102 converts the voltage $V_{IN}$ of the analog input signal 110 at the current sample point to a corresponding intermediate code value Ci 112 with four bits b3_b2_b1_b0. The final encoder 104 then encodes the intermediate code value Ci 112 based on the configuration parameter M representing the accuracy configuration to which the ADC core 102 was set when generating the intermediate code value Ci. Accordingly, at block 506 the final encoder 104 determines whether the ADC core 102 was set at the higher accuracy (M=0) or the lower accuracy (M=1). In the event that the ADC core 102 was set to the higher accuracy, at block 508 the final encoder 104 encodes the intermediate code value $C_i$ 112 to the final code value $C_f$ 114 by concatenating the bit sequence "001" at the MSB of the intermediate code value $C_i$ 112 (i.e., $C_f$=001_b3_b2_b1_b0) to provide the appropriate final output code which correlates with the accuracy configuration of reference voltage range of 0.5-1.0 V. In the event that the ADC core was set to the lower accuracy, at block 510 the final encoder 104 encodes the intermediate code value $C_i$ 112 to the final code value $C_f$ 114 by concatenating the bit sequence "000" at the LSB of the intermediate code value $C_i$ 112 (i.e., $C_f$=b3_b2_b1_b0_000) to provide the appropriate final output code in view of the accuracy configuration with the 0-4V reference voltage range.

While the A-D conversion process of blocks 504, 506, 508, and 510 is performed for one sample point, the accuracy controller 106 prepares the ADC core 102 for the next sample point by using the intermediate code value $C_i$ 112 from the current sample point to determine which of the two accuracy configurations the ADC core 102 is to be set for the next sample point. As with operation 400 described above, in operation 500 the accuracy controller 106 compares the intermediate code value $C_i$ 112 to one or more thresholds and predicts an appropriate accuracy configuration for the next sample point based on the results of these comparisons.

Accordingly, at block 512, the accuracy controller 106 determines whether the intermediate code value $C_i$ 112 is equal to MaxCi or 0 (thus indicating that the input signal $V_{IN}$ may be outside the reference voltage range and therefore the conversion accuracy may be lowered in order to obtain a suitable A-D conversion with lower accuracy), and if so, at block 513 the accuracy controller 106 sets the accuracy configuration of the ADC core 102 for the next sample point to the one with lower accuracy (M=1) and the A-D conversion process of blocks 504, 506, 508, and 510 is repeated for the voltage $V_{IN}$ of the analog input signal 110 at the next sample point.

At block 514, the accuracy controller 106 determines whether the intermediate code value $C_i$ 112 falls in a range between (MaxCi+1)/8 and (MaxCi+1)/4 (thus indicating that the accuracy of current A-D conversion can be improved at the next sample point), and if so, at block 515 the accuracy controller 106 sets the accuracy configuration of the ADC core 102 for the next sample point to the one with higher accuracy (M=0) and the A-D conversion process of blocks 504, 506, 508, and 510 is repeated for the voltage $V_{IN}$ of the analog input signal 110 at the next sample point.

At block 516, the accuracy controller 106 determines whether the intermediate code value $C_i$ 112 is in a range not covered by the threshold comparisons of blocks 512 and 514 (thus indicating the current configuration is appropriate for the next sample point), and if so, at block 517 the accuracy controller 106 maintains the current configuration of the ADC core 102 for the next sample point (i.e., next M=current M) and the A-D conversion process of blocks 504, 506, 508, and 510 is repeated for the voltage $V_{IN}$ of the analog input signal 110 at the next sample point.

Although FIGS. 4 and 5 illustrate example operations of the ADC 100 with particular reference ranges and threshold comparisons, the technique described herein is not limited to these particular examples. To illustrate, the ADC 100 may implement any number of accuracy configurations. Further, the reference voltage ranges of the ADC 100 for the corresponding accuracy configurations do not need to start at the same voltage (e.g., 0 V), but instead some or all of the reference voltage ranges may have different offsets. Moreover, although having reference voltage ranges that increase by a power of two facilitates easy scaling of the intermediate code value to the final code value by introducing a corresponding number of bits having a select bit pattern (e.g., all 0's, all 1's, or a pattern of 0's and 1's) at one or both of the least significant bit (LSB) or most significant bit (MSB) of the intermediate code value, the reference voltage ranges do not need to implement this particular relationship, but instead can implement any of a variety of relationships with the corresponding final encoding provided in accordance with the teachings of the present disclosure. Moreover, the techniques of the present disclosure are not limited to the particular example threshold values and ranges described above.

By configuring the ADC 100 such that the conversion accuracy is not uniformly distributed across the maximum input range of the ADC 100, the ADC 100 can be implemented with fewer conversion bits (and thus lower complexity and power consumption) while still providing suitable conversion accuracy in the most relevant input range. Table 3 illustrates the benefits of this approach by comparing the performance of a conventional ADC with fixed accuracy and a fixed input range, a conventional ADC with fixed accuracy and adjustable input range, and the ADC 100 of the present disclosure with adjustable accuracy and adjustable input range. The comparison is in the context of a 4-bit conversion with an analog signal at 3.6 V and an analog signal at 0.6 V.

TABLE 3

| Input Voltage | | Range | Code | Accuracy |
|---|---|---|---|---|
| 3.6 V | Conventional ADC with fixed accuracy and range | 0-4 V | 1110 | 0.25 V |
| | Conventional ADC with fixed accuracy and variable range | 0-4 V | 1110 | 0.25 V |
| | ADC 100 with non-uniform accuracy and adjustable range | 0-4 V | 1110000 | 0.25 V |
| 0.6 V | Conventional ADC with fixed accuracy and range | 0-4 V | 0010 | 0.25 V |
| | Conventional ADC with fixed accuracy and variable range | 0-1 V | 0010 | 0.25 V |
| | ADC 100 with non-uniform accuracy and adjustable range | 0-1 V | 0001010 | 0.0625 V |

As illustrated by Table 3, the ADC 100 provides the same accuracy as conventional ADCs with the same number of conversion bits at the maximum input range of 0 to 4 V. However, once the accuracy of the ADC 100 is increased by changing the reference voltage range to 0 to 1 V, the accuracy of the ADC 100 is four times the accuracy of the conventional ADCs. Thus, assuming the most relevant range is the 0 V-1 V range, the ADC of the present disclosure can provide improved accuracy over conventional ADCs in the range of interest without requiring additional conversion bits.

FIGS. 6 and 7 illustrate example implementations of the ADC 100 of FIG. 1 for dynamic power management in a light emitting diode (LED) system having a plurality of LED strings. The term "LED string," as used herein, refers to a grouping of one or more LEDs connected in series. The "head end" of a LED string is the end or portion of the LED string which receives the driving voltage/current and the "tail end" of the LED string is the opposite end or portion of the LED string. The term "tail voltage," as used herein, refers the voltage at the tail end of a LED string or representation thereof (e.g., a voltage-divided representation, an amplified representation, etc.). The term "subset of LED strings" refers to one or more LED strings.

FIG. 6 illustrates a LED system 600 having dynamic power management in accordance with at least one embodiment of the present disclosure. In the depicted example, the LED system 600 includes a LED panel 602 and a LED driver 604. The LED panel 602 includes a plurality of LED strings (e.g., LED strings 605, 606, 607, and 608). Each LED string includes one or more LEDs 609 connected in series. The LEDs 609 can include, for example, white LEDs, red, green, blue (RGB) LEDs, organic LEDs (OLEDs), etc. Each LED string is driven by the adjustable voltage $V_{OUT}$ received at the head end of the LED string from a voltage source 612 of the LED driver 604 via a voltage bus 610 (e.g., a conductive trace, wire, etc.). In the embodiment of FIG. 6, the voltage source 612 is implemented as a boost converter configured to drive the output voltage $V_{OUT}$ using a supplied input voltage.

The LED driver 604 includes a feedback controller 614 configured to control the voltage source 612 based on the tail voltages at the tail ends of the LED strings 605-608. The LED driver 604, in one embodiment, receives display data representative of which of the LED strings 605-608 are to be activated and at what times during a corresponding pulse width modulation (PWM) cycle, and the LED driver 604 is configured to either collectively or individually activate the LED strings 605-608 at the appropriate times in their respective PWM cycles based on the display data.

The feedback controller 614, in one embodiment, includes a plurality of current regulators (e.g., current regulators 615, 616, 617, and 618), an analog string select module 620, an ADC 622 (corresponding to the ADC 100 of FIG. 1), a code processing module 624, a control digital-to-analog converter (DAC) 626, an error amplifier 628, and a data/timing controller 630. In the example of FIG. 6, the current regulator 615 is configured to maintain the current $I_1$ flowing through the LED string 605 at or near a fixed current (e.g., 30 mA) when active. Likewise, the current regulators 616, 617, and 618 are configured to maintain the currents $I_2$, $I_3$, and $I_4$ flowing through the LED strings 606, 607, and 608, respectively, at or near the fixed current when active.

A current regulator typically operates more effectively when the input of the current regulator is a non-zero voltage so as to accommodate the variation in the input voltage that often results from the current regulation process of the current regulator. This buffering voltage often is referred to as the "headroom" of the current regulator. As the current regulators 615-618 are connected to the tail ends of the LED strings 605-608, respectively, the tail voltages of the LED strings 605-608 represent the amounts of headroom available at the corresponding current regulators 615-618. However, headroom in excess of that necessary for current regulation purposes results in unnecessary power consumption by the current regulator. Accordingly, as described in greater detail herein, the LED system 600 employs techniques to provide dynamic headroom control so as to maintain the minimum tail voltage of the active LED strings at or near a predetermined threshold voltage, thus maintaining the lowest headroom of the current regulators 615-618 at or near the predetermined threshold voltage. The threshold voltage can represent a determined balance between the need for sufficient headroom to permit proper current regulation by the current regulators 615-618 and the advantage of reduced power consumption by reducing the excess headroom at the current regulators 615-618.

The data/timing controller 630 receives display data and is configured to provide control signals to the other components of the LED driver 604 based on the timing and activation information represented by the display data. To illustrate, the data/timing controller 630 can provide control signals (not shown) to the current control regulators 615-618 to control which of the LED strings 605-608 are active during corresponding portions of their respective PWM cycles. The data/timing controller 630 also provides control signals to the analog minimum select module 620, the code processing module 624, and the control DAC 626 so as to control the operation and timing of these components, such as to signal the start and end of detection periods. The data/timing controller 630 can be implemented as hardware, software executed by one or more processors, or a combination thereof. To illustrate, the data/timing controller 630 can be implemented as a logic-based hardware state machine.

The analog string select module 620 includes a plurality of tail inputs coupled to the tail ends of the LED strings 605-608 to receive the tail voltages $V_{T1}$, $V_{T2}$, $V_{T3}$, and $V_{T4}$ of the LED strings 605-608, respectively, and an output to provide an analog signal 632 representative of the minimum tail voltage $V_{Tmin}$ of the LED strings 605-608 at any given point over a detection period. In one embodiment, the analog string select module 620 is implemented as a diode-OR circuit having a plurality of inputs connected to the tail ends of the LED strings 605-608 and an output to provide the analog signal 632.

The ADC 622 is configured to generate a digital code value $C_{OUT}$ representative of the voltage of the analog signal 632 at a corresponding sample point in accordance with the operation of the ADC 100 described above with respect to FIGS. 1-5.

The code processing module 624 includes an input to receive the code value $C_{OUT}$ and an output to provide a code value $C_{reg}$ based on the code value $C_{OUT}$ and either a previous value for $C_{reg}$ from a previous detection period or an initialization value. As the code value $C_{OUT}$ represents the minimum tail voltage that occurred during the detection period (e.g., a PWM cycle, a display frame period, etc.) for all of the LED strings 605-608, the code processing module 624, in one embodiment, compares the code value $C_{OUT}$ to a threshold code value, $C_{thresh}$, and generates a code value $C_{reg}$ based on the comparison. The code processing module 624 can be implemented as hardware, software executed by one or more processors, or a combination thereof. To illustrate, the code processing module 624 can be implemented as a logic-based hardware state machine, software executed by a processor, and the like.

The control DAC 626 includes an input to receive the code value $C_{reg}$ and an output to provide a regulation voltage $V_{reg}$ representative of the code value $C_{reg}$. The regulation voltage $V_{reg}$ is provided to the error amplifier 628. The error amplifier 628 also receives a feedback voltage $V_{fb}$ representative of the output voltage $V_{OUT}$. In the illustrated embodiment, a voltage divider 640 is used to generate the voltage $V_{fb}$ from the output voltage $V_{OUT}$. The error amplifier 628 compares the voltage $V_{fb}$ and the voltage $V_{reg}$ and configures a signal ADJ based on this comparison. The voltage source 612 receives the signal ADJ and adjusts the output voltage $V_{OUT}$ based on the magnitude of the signal ADJ.

There may be considerable variation between the voltage drops across each of the LED strings 605-608 due to static variations in forward-voltage biases of the LEDs 609 of each LED string and dynamic variations due to the on/off cycling of the LEDs 609. Thus, there may be significant variance in the bias voltages needed to properly operate the LED strings 605-1108. However, rather than drive a fixed output voltage $V_{OUT}$ that is substantially higher than what is needed for the smallest voltage drop as this is handled in conventional LED drivers, the LED driver 604 illustrated in FIG. 6 utilizes a feedback mechanism that permits the output voltage $V_{OUT}$ to be adjusted so as to reduce or minimize the power consumption of the LED driver 604 in the presence of variances in voltage drop across the LED strings 605-1108. Any of a variety of durations may be used for this feedback mechanism without departing from the scope of the present disclosure. To illustrate, the feedback duration could be a PWM cycle or encompass a portion of a PWM cycle, multiple PWM cycles, a certain number of clock cycles, a duration between interrupts, a duration related to video display such as video frame, and the like.

FIG. 7 illustrates an alternate implementation of the feedback controller in the LED system 600 of FIG. 6. Rather than utilizing a single ADC to convert the minimum tail voltage of the multiple LED strings at any given time as described in FIG. 6, the depicted LED system 700 of FIG. 7 utilizes an ADC for each LED string. Accordingly, the LED driver 704 of FIG. 7 includes a plurality of ADCs 715, 716, 717, and 718 and a digital minimum select module 720. The ADC 715 includes an input coupled to the tail end of the LED string 605 and an output to provide a code value $C_1$ representative of the voltage of the tail end of the LED string 605 at a corresponding sample point in a manner described above with respect to the ADC 100 described above with reference to FIGS. 1-5. The ADCs 716-718 are similarly configured with respect to LED strings 606-708 for the generation of code values $C_2$, $C_3$, and $C_4$, respectively, for the sample point. At the end of a detection period, the digital minimum select module 720 identifies the lowest of the code values C1, C2, C3, and C4 and forwards this lowest code value as the code value $C_{OUT}$ for processing by the code processing module 624 as described above.

In accordance with one aspect of the present disclosure, a circuit comprises an analog-to-digital converter (ADC) core comprising an input to receive an input signal and an output to provide a first digital value having a first number of bits, the ADC core to generate the first digital value based on the input signal and an accuracy configuration of the ADC core. The circuit further comprises an encoder to generate a second digital value have a second number of bits based on the first digital value and the accuracy configuration of the ADC core, the second number of bits being greater than the first number of bits. The circuit also comprises an accuracy controller to adjust the accuracy configuration of the ADC core based on a relationship between the first digital value and at least one threshold. The encoder can generate the second digital value by inserting bits having a select bit pattern at one or both of the most significant bit (MSB) and the least significant bit (LSB) of the first digital value, wherein the number of inserted at one or both of the MSB and the LSB is based on the accuracy configuration of the ADC core.

The ADC core can comprise an input adjuster module to at least one of scale and offset the input signal to generate a modified input signal, wherein the ADC core generates the first digital value based on the modified input signal; and the controller adjusts the accuracy configuration of the ADC core by adjusting a scaling and an offset applied to the input signal by the input adjuster module based on the first digital value. In this case, the ADC core can generate the first digital value based on one or more adjustable reference voltages, and the controller can adjust the accuracy configuration of the ADC core by adjusting at least one of the one or more adjustable reference voltages based on the first digital value. In one embodiment, the ADC core comprises a flash ADC having a resistive ladder, and at least one of the one or more adjustable reference voltages comprises an end reference voltage at an end of the resistive ladder.

In one embodiment, the circuit further includes an output to provide an output voltage to a head end of each light emitting diode (LED) string of a plurality of LED strings and a plurality of tail inputs, each tail input to couple to a tail end of a corresponding LED string of the plurality of LED strings, wherein the input signal comprises a minimum tail voltage of the plurality of LED strings and the second digital value comprises a digital code value representative of a minimum voltage of the input signal over a first duration. The circuit further includes a feedback controller coupled to the plurality of tail inputs, the feedback controller to adjust the output voltage for a second duration subsequent to a first duration based on the output voltage and the digital code value. The circuit also can include a minimum select module configured to provide the minimum tail voltage of the tail voltages of the plurality of LED strings to the input of the ADC core over the first duration.

In another embodiment, the circuit includes an output to provide an output voltage to a head end of each light emitting diode (LED) string of a plurality of LED strings, and a plurality of tail inputs, each tail input to couple to a tail end of a corresponding LED string of the plurality of LED strings, wherein the input signal comprises a tail voltage of a corresponding LED string of the plurality of LED strings and the second digital value comprises a digital code value representative of the tail voltage of the corresponding LED string. The circuit further includes a feedback controller coupled to the plurality of tail inputs, the feedback controller to adjust the output voltage for a second duration subsequent to a first duration based on the output voltage and the digital code value.

In accordance with another aspect, a method includes generating, using an analog-to-digital converter (ADC) core, a first digital value based on a first voltage representative of an input signal at a first time and based on a first accuracy configuration of the ADC core, the first digital value having a first number of bits. The method further includes generating, using an encoder, a second digital value based on the first digital value and the first accuracy configuration, the second digital value having a second number of bits greater than the first number of bits. The method also includes adjusting the ADC core to have a second accuracy configuration based on a relationship between the first digital value and at least one threshold. In one embodiment, generating the second digital value comprises inserting bits having a select bit pattern at one or both of the most significant bit (MSB) and the least significant bit (LSB) of the first digital value, wherein the number of bits inserted at one or both of the MSB and the LSB is based on the first accuracy configuration of the ADC core.

Further, the method can include generating, using the ADC core, a third digital value based on a second voltage representative of the input signal at a second time subsequent to the first time and based on the second accuracy configuration of the ADC core, the third digital value having the first number of bits and generating, using the encoder, a fourth digital value based on the third digital value and the second reference range, the fourth digital value having the second number of bits. The method also can include adjusting the ADC core to have a third accuracy configuration based on a relationship between the third digital value and at least one threshold.

In one embodiment, the method further includes scaling the input signal to generate a scaled input signal, and wherein the first voltage comprises a voltage of the scaled input signal at the first time, wherein adjusting the ADC core to have the second accuracy configuration based on the first digital value comprises adjusting the scaling applied to the input signal based on the first digital value. In one embodiment, the ADC core generates the first digital value based one or more adjustable reference voltages and adjusting the ADC core to have the second accuracy configuration based on the first digital value further comprises adjusting at least one of the one or more adjustable reference voltages based on the first digital value.

In one embodiment, generating the second digital value comprises inserting bits having a select bit pattern at one or both of the most significant bit (MSB) and the least significant bit (LSB) of the first digital value, wherein the number of bits inserted at one or both of the MSB and the LSB is based on the first accuracy configuration of the ADC core.

In one embodiment, the method further includes providing an output voltage to a head end of each light emitting diode (LED) string of a plurality of LED strings, wherein the input signal comprises a minimum tail voltage of the plurality of LED strings and the second digital value represents a minimum tail voltage of the plurality of LED strings over the detection period. The method also includes adjusting the output voltage for another period following the detection period based on the second digital value.

The term "another", as used herein, is defined as at least a second or more. The terms "including", "having", or any variation thereof, as used herein, are defined as comprising. The term "coupled", as used herein with reference to electro-optical technology, is defined as connected, although not necessarily directly, and not necessarily mechanically.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A circuit comprising:
    an analog-to-digital converter (ADC) core comprising an input to receive an input signal and an output to provide a first digital value having a first number of bits, the ADC core to generate the first digital value based on the input signal and an accuracy configuration of the ADC core;
    an encoder to generate a second digital value having a second number of bits based on the first digital value and the accuracy configuration of the ADC core, the second number of bits being greater than the first number of bits; and
    an accuracy controller to adjust the accuracy configuration of the ADC core based on a relationship between the first digital value and at least one threshold;
    wherein:
    the ADC core comprises an input adjuster module to at least one of scale and offset the input signal to generate a modified input signal, wherein the ADC core generates the first digital value based on the modified input signal; and
    the accuracy controller adjusts the accuracy configuration of the ADC core by adjusting a scaling and an offset applied to the input signal by the input adjuster module based on the first digital value.

2. The circuit of claim 1, wherein the encoder generates the second digital value by inserting bits having a select bit pattern at one or both of the most significant bit (MSB) and the least significant bit (LSB) of the first digital value, wherein the number of inserted at one or both of the MSB and the LSB is based on the accuracy configuration of the ADC core.

3. The circuit of claim 2, wherein the ADC core comprises one of a flash ADC or a pipeline ADC.

4. The circuit of claim 2, wherein the circuit provides non-uniform conversion accuracy.

5. A method comprising:
    generating, using an analog-to-digital converter (ADC) core, a first digital value based on a first voltage representative of an input signal at a first time and based on a first accuracy configuration of the ADC core, the first digital value having a first number of bits;
    generating, using an encoder, a second digital value based on the first digital value and the first accuracy configuration, the second digital value having a second number of bits greater than the first number of bits; and
    adjusting the ADC core to have a second accuracy configuration based on a relationship between the first digital value and at least one threshold, the adjusting comprising at least one of:
    adjusting a scaling and an offset applied to the input signal; and
    adjusting a value of voltage references applied to respective ends of a resistive ladder.

6. The method of claim 5, further comprising:
    generating, using the ADC core, a third digital value based on a second voltage representative of the input signal at a second time subsequent to the first time and based on the second accuracy configuration of the ADC core, the third digital value having the first number of bits; and
    generating, using the encoder, a fourth digital value based on the third digital value and the second reference range, the fourth digital value having the second number of bits.

7. The method of claim 6, further comprising:
    adjusting the ADC core to have a third accuracy configuration based on a relationship between the third digital value and at least one threshold.

8. The method of claim 5, wherein:
    the ADC core generates the first digital value based on one or more adjustable reference voltages; and
    adjusting the ADC core to have the second accuracy configuration based on the first digital value comprises adjusting at least one of the one or more adjustable reference voltages based on the first digital value.

9. The method of claim 5, wherein generating the second digital value comprises inserting bits having a select bit pattern at one or both of the most significant bit (MSB) and the least significant bit (LSB) of the first digital value, wherein the number of bits inserted at one or both of the MSB and the LSB is based on the first accuracy configuration of the ADC core.

10. The method of claim 5, further comprising:
    providing an output voltage to a head end of each light emitting diode (LED) string of a plurality of LED strings, wherein the input signal comprises a minimum tail voltage of the plurality of LED strings and the second digital value represents a minimum tail voltage of the plurality of LED strings over the detection period; and
    adjusting the output voltage for another period following the detection period based on the second digital value.

11. The method of claim 5, wherein adjusting the ADC core to have a second accuracy configuration based on a relationship between the first digital value and at least one threshold comprises adjusting a scaling and an offset applied to the input signal.

12. The method of claim 5, wherein adjusting the ADC core to have a second accuracy configuration based on a relationship between the first digital value and at least one threshold comprises adjusting a value of voltage references applied to respective ends of a resistive ladder.

13. A circuit comprising:
an analog-to-digital converter (ADC) core comprising an input to receive an input signal and an output to provide a first digital value having a first number of bits, the ADC core to generate the first digital value based on the input signal and an accuracy configuration of the ADC core;
an encoder to generate a second digital value having a second number of bits based on the first digital value and the accuracy configuration of the ADC core, the second number of bits being greater than the first number of bits; and
an accuracy controller to adjust the accuracy configuration of the ADC core based on a relationship between the first digital value and at least one threshold
wherein:
the ADC core generates the first digital value based on one or more adjustable reference voltages;
the accuracy controller adjusts the accuracy configuration of the ADC core by adjusting at least one of the one or more adjustable reference voltages based on the first digital value:
the ADC core comprises a flash ADC having a resistive ladder; and
at least one of the one or more adjustable reference voltages comprises an end reference voltage at an end of the resistive ladder.

14. A circuit comprising:
an analog-to-digital converter (ADC) core comprising an input to receive an input signal and an output to provide a first digital value having a first number of bits, the ADC core to generate the first digital value based on the input signal and an accuracy configuration of the ADC core;
an encoder to generate a second digital value having a second number of bits based on the first digital value and the accuracy configuration of the ADC core, the second number of bits being greater than the first number of bits;
an accuracy controller to adjust the accuracy configuration of the ADC core based on a relationship between the first digital value and at least one threshold; and
an output to provide an output voltage to a head end of each light emitting diode (LED) string of a plurality of LED strings.

15. The circuit of claim 14, wherein:
the ADC core generates the first digital value based on one or more adjustable reference voltages; and
the accuracy controller further adjusts the accuracy configuration of the ADC core by adjusting at least one of the one or more adjustable reference voltages based on the first digital value.

16. The circuit of claim 14, further comprising:
a plurality of tail inputs, each tail input to couple to a tail end of a corresponding LED string of the plurality of LED strings, wherein the input signal comprises a minimum tail voltage of the plurality of LED strings and the second digital value comprises a digital code value representative of a minimum voltage of the input signal over a first duration; and
a feedback controller coupled to the plurality of tail inputs, the feedback controller to adjust the output voltage for a second duration subsequent to a first duration based on the output voltage and the digital code value.

17. The circuit of claim 16, further comprising:
a minimum select module configured to provide the minimum tail voltage of the tail voltages of the plurality of LED strings to the input of the ADC core over the first duration.

18. The circuit of claim 14, further comprising:
a plurality of tail inputs, each tail input to couple to a tail end of a corresponding LED string of the plurality of LED strings, wherein the input signal comprises a tail voltage of a corresponding LED string of the plurality of LED strings and the second digital value comprises a digital code value representative of the tail voltage of the corresponding LED string; and
a feedback controller coupled to the plurality of tail inputs, the feedback controller to adjust the output voltage for a second duration subsequent to a first duration based on the output voltage and the digital code value.

19. The method of claim 11, wherein adjusting a scaling and an offset applied to the input signal further comprises:
scaling the input signal to generate a scaled input signal; and
wherein:
the first voltage comprises a voltage of the scaled input signal at the first time; and
adjusting the ADC core to have the second accuracy configuration based on the first digital value comprises adjusting the scaling applied to the input signal based on the first digital value.

20. The method of claim 19 wherein:
the ADC core generates the first digital value based one or more adjustable reference voltages; and
adjusting the ADC core to have the second accuracy configuration based on the first digital value further comprises adjusting at least one of the one or more adjustable reference voltages based on the first digital value.

* * * * *